United States Patent [19]

Sugimoto

[11] Patent Number: 4,902,968
[45] Date of Patent: Feb. 20, 1990

[54] CONNECTOR TERMINAL CHECKING TOOL

[75] Inventor: Yasuyoshi Sugimoto, Kosai, Japan

[73] Assignee: Yazaki Corporation, Tokyo, Japan

[21] Appl. No.: 367,594

[22] Filed: Jun. 19, 1989

[30] Foreign Application Priority Data

Jun. 24, 1988 [JP] Japan ................................ 63-154996

[51] Int. Cl.$^4$ ............................................ G01R 31/04
[52] U.S. Cl. ................................ 324/158 F; 324/538
[58] Field of Search ............... 324/158 P, 158 F, 538;
29/705; 340/687; 439/488, 489

[56] References Cited

U.S. PATENT DOCUMENTS 4,507,697  3/1985  Ozil et al. ............................ 439/489

FOREIGN PATENT DOCUMENTS 55-8221   2/1980  Japan .
58-162579 10/1983 Japan .
58-162580 10/1983 Japan .

Primary Examiner—Reinhard J. Eisenzopf
Assistant Examiner—Edward Urban
Attorney, Agent, or Firm—Armstrong, Nikaido Marmelstein Kubovcik & Murray

[57] ABSTRACT

A connector terminal checking tool including a base, a connector receiving member fixedly provided on one end portion of the base for receiving a connector to be checked, and a connector checking member movably provided on the other end portion of the base in opposed relationship to the connector receiving member. The connector checking member includes a plurality of check terminals adapted to be electrically connected to a plurality of terminals disposed in a connector housing of the connector to form a closed circuit when the connector is received into the connector receiving member, whereby breaking of the terminals of the connector is checked. The connector receiving member is cooperatively provided with means for detecting projection of a terminal locking spacer mounted in the connector housing of the connector projecting from a side surface or a back surface of the connector housing, wherein when the connector is received into the connector receiving member, incomplete mounting of the spacer in the connector is detected by the detector.

5 Claims, 4 Drawing Sheets

CONNECTOR TERMINAL CHECKING TOOL

BACKGROUND OF THE INVENTION

The present invention relates to the improvement in a connector terminal checking tool for checking terminals in a connector for use in connection of wire harnesses or electrical instruments in an automobile or the like.

In such a connector, female or male terminals are received in terminal receiving chambers defined in a connector housing of the connector, and these terminals are locked in so-called a terminal lance or case lance manner so as to prevent the terminals from being drawn off from the terminal receiving chambers. The female or male connector is fitted with another male or female connector to thereby obtain electrical connection between the female and male terminals in both the connectors. In using the connector, it is never permitted that the terminals will be drawn off by a tensile force or the like to be applied to electrical wires connected to the terminals, and that the electrical connection between the mating female and male terminals will become imperfect.

Under the circumstances, there has been proposed in Japanese Utility Model Publication No. 55-8221 a connector terminal checking tool capable of checking the mechanical and electrical engaged conditions of the terminals fixedly received in a multipolar connector.

Further, there has been disclosed in Japanese Utility Model Laid-open Publication Nos. 58-162579 and 58-162580, for example, a technique for more reliably preventing the terminals from being drawn off from the viewpoint of recent demand of increased safety in an automobile. This technique includes a lock cover and a connector holder having a stopper (which will be hereinafter referred to as a terminal locking spacer) mounted on a side surface or a back surface of the connector housing, so that the locking of the terminals may be further ensured solely by the spacer or in combination with the terminal lance or case lance locking method as mentioned above.

However, as the terminal locking spacer is smaller than the connector housing, there is a possibility that incomplete mounting or locking of the spacer will not be checked in assembling the connector.

SUMMARY OF THE INVENTION

It is an object of the present invention to provide a connector terminal checking tool which may check the incomplete mounting of the terminal locking spacer to the connector simultaneously with checking of electrical disconnection of the terminals in the connector.

According to the present invention, there is provided in a connector terminal checking tool including a base, a connector receiving member fixedly provided on one end portion of the base for receiving a connector to be checked, and a connector checking member movably provided on the other end portion of the base in opposed relationship to the connector receiving member, the connector checking member including a plurality of check terminals adapted to be electrically connected to a plurality of terminals disposed in a connector housing of the connector to form a closed circuit when the connector is received into said connector receiving member, whereby electrical disconnection of the terminals of the connector is checked; the improvement comprising detecting means for detecting projection of a terminal locking spacer mounted in the connector housing of the connector projecting from a side surface or a back surface of the connector housing, wherein when the connector is received into the connector receiving member, incomplete mounting of the spacer in the connector is detected by the detecting means.

As mentioned above, the detecting means is so provided as to detect the projection of the spacer mounted in the connector, and such incomplete mounting of the spacer is mechanically or electrically recognized at the same time when breaking of the terminals in the connector is checked. Accordingly, it is possible to reliably prevent the terminals in the connector from being drawn off because of the incomplete mounting of the terminal locking spacer.

Other objects and features of the invention will be more fully understand from the following detailed description and appended claims when taken with the accompanying drawings.

DETAILED DESCRIPTION OF THE PREFERRED EMBODIMENTS

Figure 1:
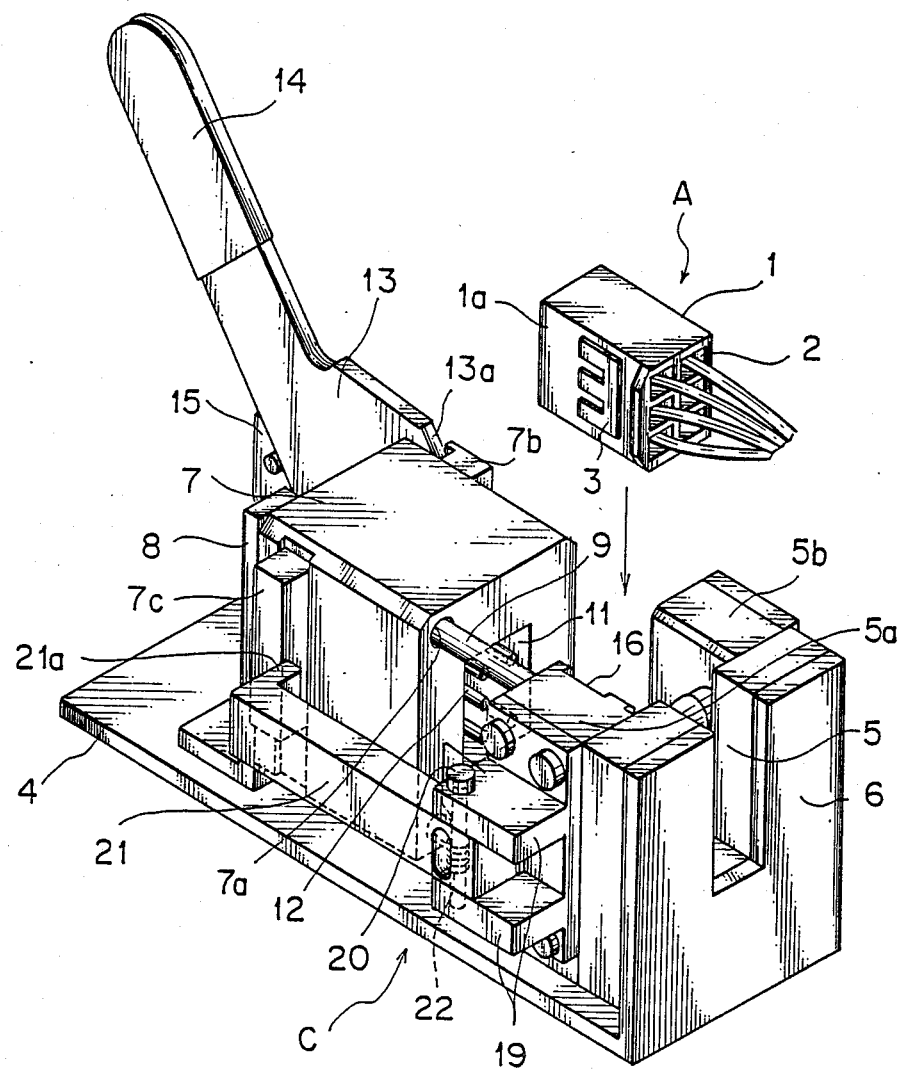
FIG. 1 is a perspective view of a first preferred embodiment of the connector terminal checking tool according to the present invention.
Figure 2:
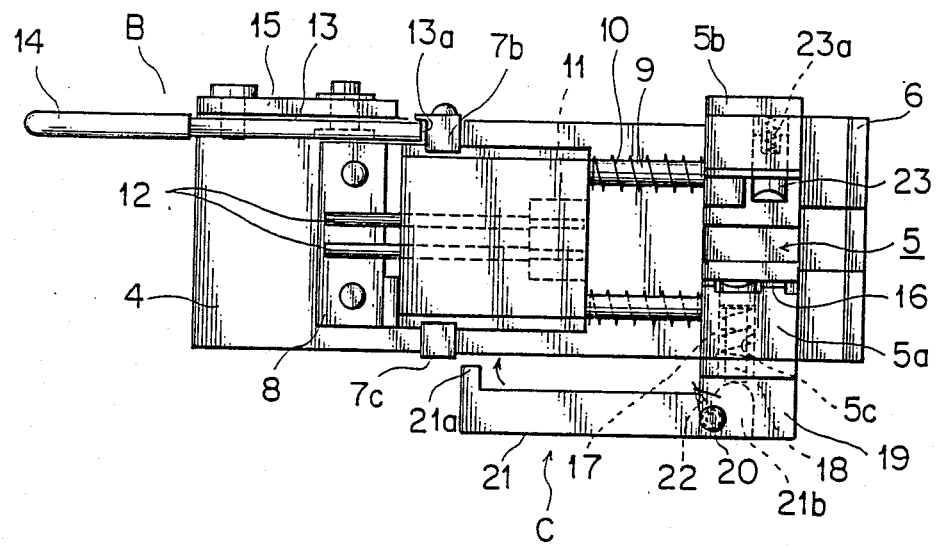
FIG. 2 is a plan view of FIG. 1.
Figure 3A:
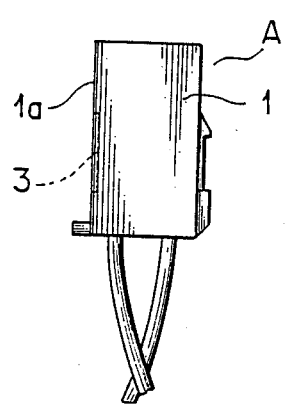
FIGS. 3A and 3B are plan views of the connector under the completely mounted condition and the incompletely mounted condition of the terminal locking spacer, respectively.
Figure 3B:
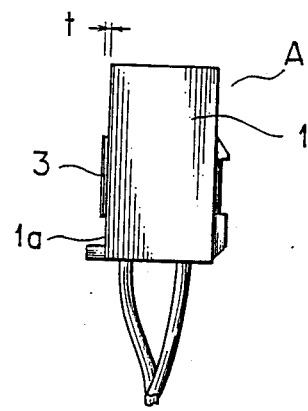

Referring to FIGS. 1 and 2, reference numerals A and B respectively designate a connector to be checked and a connector terminal checking tool. The connector A includes a connector housing 1 formed with a plurality of terminal receiving chambers 2 for receiving a plurality of terminals (not shown). A terminal locking spacer 3 for preventing the terminals from being drawn off is mounted on a side surface 1a of the connector housing 1. When the terminal locking space 3 is completely mounted, an outer surface of the spacer 3 is flush with the side surface 1a of the connector housing 1 as shown in FIG. 3A. If the spacer 3 is incompletely mounted, it projects from the side surface 1a of the housing 1 to create a difference t as shown in FIG. 3B. A terminal locking method for locking the terminals in the terminal receiving chambers 2 and a locking mechanism for locking the terminals by means of the spacer 3 are similar to the prior art, and the explanation thereof will be therefore omitted.

The connector terminal checking tool B includes a base 4 and a mounting plate 6 extending upwardly from one end of the base 4. A connector receiving member 5 for receiving the connector A is fixed to an inside surface of the mounting plate 6. A connector checking member 7 is movably provided on the base 4 in opposed relationship to the connector receiving member 5 in such a manner as to be movable toward and away from the connector receiving member 5.

A vertical plate 8 is fixed on the base 4 at a position behind the connector checking member 7, and a pair of guide shafts 9 are fixedly provided between the vertical plate 8 and the mounting plate 6. The guide shafts 9 are inserted through a pair of through-holes 7a of the connector checking member 7, and are also inserted into a pair of coil springs 10 interposed between the connector checking member 7 and the connector receiving member 5, so that the connector checking member 7 may be normally biased by the coil springs 10 toward the fixed plate 8. Further, a recess 11 for receiving the connector A is formed on the inside surface of the connector checking member 7 opposed to the inside surface of the connector receiving member 5. The recess 11 is provided with a plurality of check terminals to be electrically connected to the terminals of the connector A, so as to check electrical disconnection of the terminals.

A cam 13 is pivotally supported to a cam mounting plate 15, and is provided with a cam lever 14. When the cam lever 14 is pulled up, a cam surface 13a of the cam 13 is brought into engagement with a cam follower 7b mounted on a side surface of the connector checking member 7, thereby moving the connector checking member 7 toward the connector receiving member 5 against the biasing force of the coil springs 10.

The above-mentioned construction is similar to that of the connector terminal checking tool disclosed in Japanese Utility Model Publication No. 55-8221 as previously referred. According to the present invention, the connector receiving member 5 is provided with a detecting mechanism C for detecting incomplete mounting of the spacer 3 to the connector A.

The detecting mechanism C is constructed in the following manner. That is, a side wall 5a of the connector receiving member 5 is formed on its inside surface with a recess 16 for receiving the spacer 3 if the spacer 3 projects from the side surface 1a of the connector housing 1. The side wall 5a is further formed with a pin hole 5c for locating therein a detecting pin 18 and a coil spring 17 for biasing the detecting pin 18. The detecting pin 18 is normally biases by the coil spring 17 to project out of the pin hole 5c into the recess 16, and is retractable from the recess 16 into the pin hole 5c when urged by the spacer 3 inserted into the recess 16. The side wall 5a is further formed on its outside surface with a pair of upper and lower projecting plates 19 for mounting a base portion of a lock arm 21. The base portion of the lock arm 21 is pivotably supported by a pivot pin 20 inserted through both the projecting plates 19. The lock arm 21 is formed at its free end with a locking portion 21a adapted to be engaged with an engaging portion 7c formed on the other side surface of the connector checking member 7 opposite the side surface on which the cam follower 7b is formed. The base portion of the lock arm 21 is formed with a contact portion 21b contacting an end of the detecting pin 18. A return spring 22 is provided between the lock arm 21 and the projecting plates 19, so as to normally maintain the lock arm 21 in an unlocked position where the locking portion 21a is disengaged from the engaging portion 7c. Further, another side wall 5b of the connecting receiving member 5 is provided with a pusher pin 23 biased by a coil spring 23a, so that the connector A received into the connector receiving member 5 may be urged toward the side wall 5a by the pusher pin 23.

In operation, when the spacer 3 is completely mounted in the connector housing 1 in such a manner that the outer surface of the spacer 3 is flush with the side surface 1a of the housing 1 as shown in FIG. 3A, the connector A can be smoothly inserted into the connector receiving member 5 of the connector checking tool B. After inserting the connector A into the receiving member 5, the cam lever 14 is pulled up to move the connector checking member 7 toward the connector A until the check terminals 12 in the connector checking member 7 come into contact with the terminals in the connector A. Thus, electrical continuity test of the terminals in the connector A is normally carried out.

On the other hand, if the spacer 3 is incompletely mounted in the connector housing 1 in such a manner that the outer surface of the spacer 3 projects from the side surface 1a of the housing 1 as shown in FIG. 3B, the outer surface of the spacer 3 received in the recess 16 of the side wall 5a of the connector receiving member 5 urges the detecting pin 18 against the coil spring 17. As a result, the contact portion 21b of the lock arm 21 contacting the end of the detecting pin 18 is urged by the detecting pin 18, thereby pivoting the lock arm 21 about the pivot pin 20 in a clockwise direction as depicted by an arrow in FIG. 2. Accordingly, the locking portion 21a of the lock arm 21 is brought into engagement with the engaging portion 7c of the connector checking member 7, thereby hindering the movement of the connector checking member 7 toward the connector A. In other words, even when the cam lever 14 is pulled up, the connector checking member 7 cannot be moved toward the connector A. Therefore, an operator can recognize the incomplete mounting of the spacer 3 to the connector A.

Figure 4:
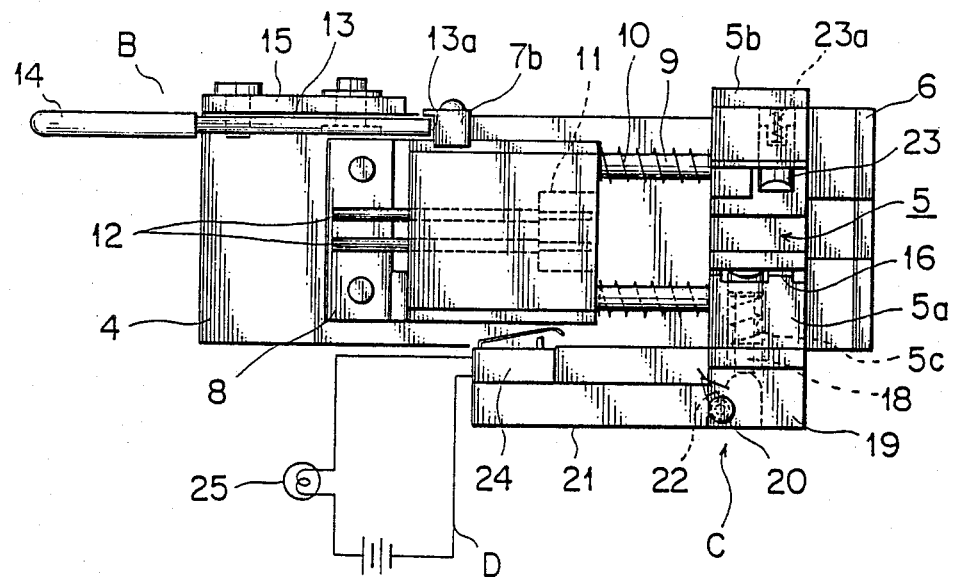
FIG. 4 is a plan view of a second preferred embodiment.

As mentioned above, the incomplete mounting of the terminal locking spacer 3 to the connector A is recognized by mechanically stopping the movement of the connector checking member 7. Such a mechanical construction may be replaced by an electrical construction as shown in FIG. 4. Referring to FIG. 4, a microswitch 24 is provided at the free end of the lock arm 21, and the microswitch 24 is connected to a warning circuit D including a warning lamp (or buzzer) 25. If the spacer 3 is incompletely mounted to the connector A, the lock arm 21 is pivoted to turn on the microswitch 24 and thereby turn on the warning lamp 25. The warning circuit D may be replaced by an indicating circuit designed to turn off a lamp when the incomplete mounting of the spacer 3 is detected.

Figure 5:
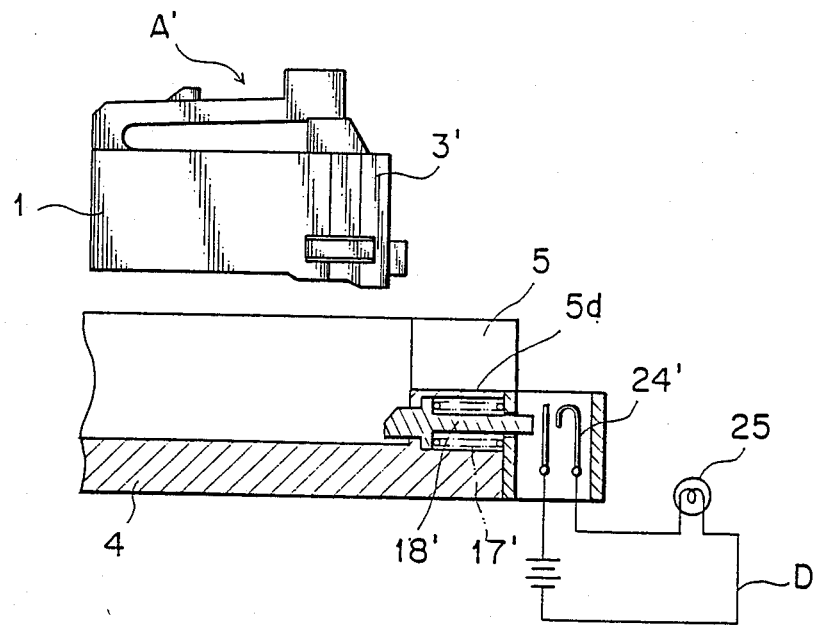
FIG. 5 is a sectional view of the essential part of a third preferred embodiment.

Referring next to FIG. 5 which shows another preferred embodiment, a terminal locking spacer 3' is mounted to a back surface of the connector housing 1 of a connector A', and a detecting pin 18' is located in a bottom wall portion 5d of the connector receiving member 5 in such a manner as to be retractably biased by a coil spring 17'. A microswitch 24' is provided as to be directly operated by the detecting pin 18', and the microswitch 24' is connected to the warning circuit D. When the connector A' is received into the connector receiving member 5, the detecting pin 18' is retracted by the spacer 3' if the spacer 3' is incompletely mounted. As a result, the microswitch 24' is directly turned on by the detecting pin 18' to thereby close the warning circuit D.

Figure 6:
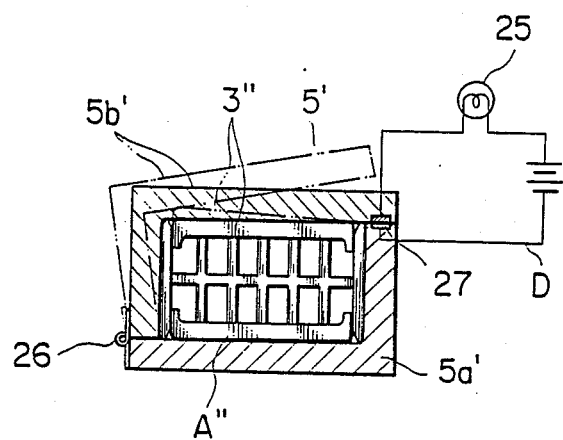
FIG. 6 is a vertical sectional view of the connector receiving member in the connector terminal checking tool of a fourth preferred embodiment.
Figure 7:
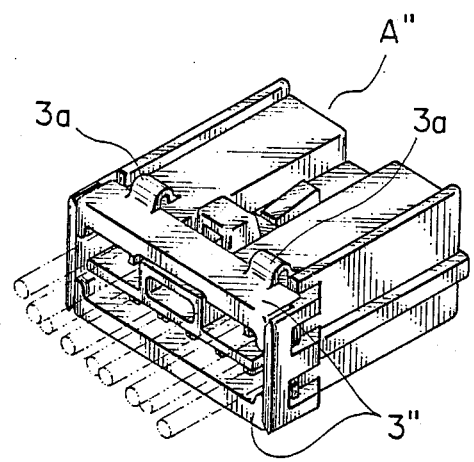
FIG. 7 is a perspective view of the connector employed in the fourth preferred embodiment.

Referring next to FIGS. 6 and 7 which show a further modified embodiment, a terminal locking spacer 3" to be mounted to a connector A" is pivotally openable by means of hinges 3a. Further, a connector receiving member 5' of the connector checking tool B is constructed of an L-shaped fixed wall 5a' and a cover wall 5b' openably connected through hinges 26 to the fixed wall 5a'. A pair of connectors 27 are so provided as to contact with each other when both the walls 5a' and 5b' are fully closed. The contactors 27 are connected to the warning circuit D. When the spacer 3" is in completely mounted to the connector A", the cover wall 5b' cannot be closed. Accordingly, the contactors do not contact with each other, and the lamp 25 is not turned on, thus recognizing the incomplete mounting of the spacer 3". In this case, the spacer 3" can be completely mounted to the connector A" by forcibly closing the cover wall 5b'.

While the invention has been described with reference to specific embodiments, the description is illustrative and is not to construed as limiting the scope of the invention. Various modifications and changes may occur to those skilled in the art without departing from the spirit and scope of the invention as defined by the appended claims.

What is claimed is:

1. A connector terminal checking tool comprising:
 a base,
 a connector receiving member fixedly provided on one end portion of said base for receiving a connector to be checked, and
 a connector checking member movably provided on the other end portion of said base in opposed relationship to said connector receiving member, said connector checking member including a plurality of check terminals adapted to be electrically connected to a plurality of terminals disposed in a connector housing of said connector to form a closed circuit when said connector is received into said connector receiving member, whereby electrical disconnection of said terminals of said connector is checked;
 characterized in that said connector receiving member further comprises detecting means for detecting projection of a terminal locking spacer mounted in said connector housing of said connector projecting from a side surface or a back surface of said connector housing.

2. The connector terminal checking tool as claimed in claim 1, wherein said detecting means comprises a detecting pin adapted to retractably abut against said spacer and a warning or indicating circuit is adapted to be operated when said detecting pin is retracted by said spacer.

3. The connector terminal checking tool as claimed in claim 1, wherein said detecting means comprises a detecting pin adapted to retractably abut against said spacer and a pivotable lock arm engaging with said detecting pin at one end thereof, wherein when said detecting pin is retracted by said spacer, said lock arm is pivoted to stop movement of said connector checking member toward said connector received in said connector receiving member.

4. The connector terminal checking tool as claimed in claim 3, herein said lock arm is provided at the other end thereof with a microswitch adapted to contact said connector checking member when said detecting pin is retracted by said spacer to pivot said lock arm, and further comprising a warning or indicating circuit adapted to be operated by said microswitch.

5. The connector checking tool as claimed in claim 1, wherein said connector receiving member comprises a fixed wall for receiving said connector, a cover wall for openably closing said fixed wall, and a pair of contactors provided on said fixed wall and said cover wall and adapted to contact with each other when said cover wall is fully closed with respect to said fixed wall, and further comprising a warning or indicating circuit adapted to be operated by said contactors.

* * * * *